United States Patent [19]
Guidash

[11] Patent Number: 5,338,946
[45] Date of Patent: Aug. 16, 1994

[54] SOLID STATE IMAGE SENSOR WITH FAST RESET

[75] Inventor: Robert M. Guidash, Rush, N.Y.

[73] Assignee: Eastman Kodak Company, Rochester, N.Y.

[21] Appl. No.: 2,446

[22] Filed: Jan. 8, 1993

[51] Int. Cl.$^5$ ............... H01L 29/60; H01L 29/796; H01L 31/05
[52] U.S. Cl. ................... 257/223; 257/258; 257/443
[58] Field of Search ............... 257/222, 258, 232, 249, 257/250, 229, 230, 223, 443, 444

[56] References Cited

U.S. PATENT DOCUMENTS

| | | | |
|---|---|---|---|
| 3,896,485 | 7/1975 | Early | 357/24 |
| 4,142,198 | 2/1979 | Finnila et al. | 357/24 |
| 4,587,562 | 5/1986 | Imai et al. | 358/212 |
| 4,884,142 | 11/1989 | Suzuki | 358/213.19 |
| 4,984,045 | 1/1991 | Matsunaga | 357/24 |
| 4,996,686 | 2/1991 | Imai et al. | 377/60 |
| 5,235,196 | 8/1993 | Anagnostopoulos et al. | 257/223 |

FOREIGN PATENT DOCUMENTS 0138186 8/1983 Japan .................. 257/223

Primary Examiner—Rolf Hille
Assistant Examiner—David Hardy
Attorney, Agent, or Firm—Raymond L. Owens

[57] ABSTRACT

A solid-state image sensor has a body of a semiconductor material of one conductivity type having a surface. A plurality of photodetectors are in the body at the surface and are arranged in at least one line. The photodetectors are adapted to photogenerate charge carriers. A CCD shift register is in the body at the surface and extends along the line of photodetectors. Transfer means is provided between the photodetectors and the CCD shift register for transferring charge carriers from the photodetectors to the CCD shift register. A buried region of a conductivity type opposite that of the body is in the body and spaced from the surface. The buried region extends under the photodetectors, CCD shift register, and transfer means. A contact region extends through the body from the surface to the buried region. The contact region is of the same conductivity type as the buried region but of higher conductivity. The contact region is electrically connected to a source of voltage for selectively biasing the buried region so as to transfer electrons from the photodetectors, CCD shift register, and transfer means so as to reset the image sensor.

5 Claims, 2 Drawing Sheets

ELECTROSTATIC POTENTIAL

SOLID STATE IMAGE SENSOR WITH FAST RESET

FIELD OF THE INVENTION

The present invention is directed to a solid-state image sensor which can be reset quickly during the scan period of the sensor, and, more particularly, to a solid-state image sensor having means for resetting all charge accumulation and transfer regions.

BACKGROUND OF THE INVENTION

One type of solid-state image sensor is a charge-coupled device (CCD) image sensor which, in general, comprises a substrate of a semiconductor material having therein an array of photodetectors, such as photodiodes, arranged in one or more lines with a CCD shift register extending along each line of the photodetectors. Each of the CCD shift registers comprises a channel region in the substrate extending along and spaced from the line of photodetectors and a plurality of gate electrodes extending across and insulated from the channel region. Transfer means is provided for transferring photogenerated charge, i.e., electrons, from the photodetectors to the channel of its respective CCD shift register. The CCD shift registers transfer the electrons to an output circuit of the CCD image sensor. Other types of solid-state image sensors are similar except they use other types of shift registers, such as MOS capacitor arrays.

In some applications of the solid-state image sensor it is desirable to be able to halt operation at any time, i.e., reset the device and then resume normal operation. However, present solid-state image sensors do not have the ability to be easily reset during operation, particularly the charge transfer regions, i.e. the shift registers and transfer regions between the photodetectors and the shift registers. Thus, present devices must be operated completely through a clocking cycle prior to resuming operation.

SUMMARY OF THE INVENTION

In one aspect, the present invention is directed to an image sensor. The image sensor comprises a body of a semiconductor material of one conductivity type having a surface, a plurality of photodetectors, transfer means, and charge carrier removing means. The plurality of photodetectors are in the body at the surface and are adapted to photogenerate and accumulate charge carriers. The transfer means is in the body at the surface adjacent the photodetectors for transferring the photogenerated electrons from the photodetectors. The charge carrier removing means is provided in the body under and spaced from the photodetectors and the transfer means for selectively removing any charge carriers in the photodetectors and transfer means so as to reset the image sensor.

In another aspect, the present invention is directed to an image sensor. The image sensor comprises a body of a semiconductor material of one conductivity type having a surface, a plurality of photodetectors, a shift register, a buried region, and a contact region. The plurality of photodetectors are in the body at the surface and are arranged in at least one line. The shift register is in the body at the surface and extends along the line of photodetectors. The buried region is of a conductivity opposite that of the body is in the body and spaced from the surface. The buried region extends under the photodetectors and the CCD shift register. The contact region extends through the body from the surface to the buried region and is of the same conductivity type as the buried region but of higher conductivity.

The invention will be better understood from the following mote detailed description taken with the claims and accompanying drawings.

The drawings are not necessarily to scale.

DETAILED DESCRIPTION

Figure 1:
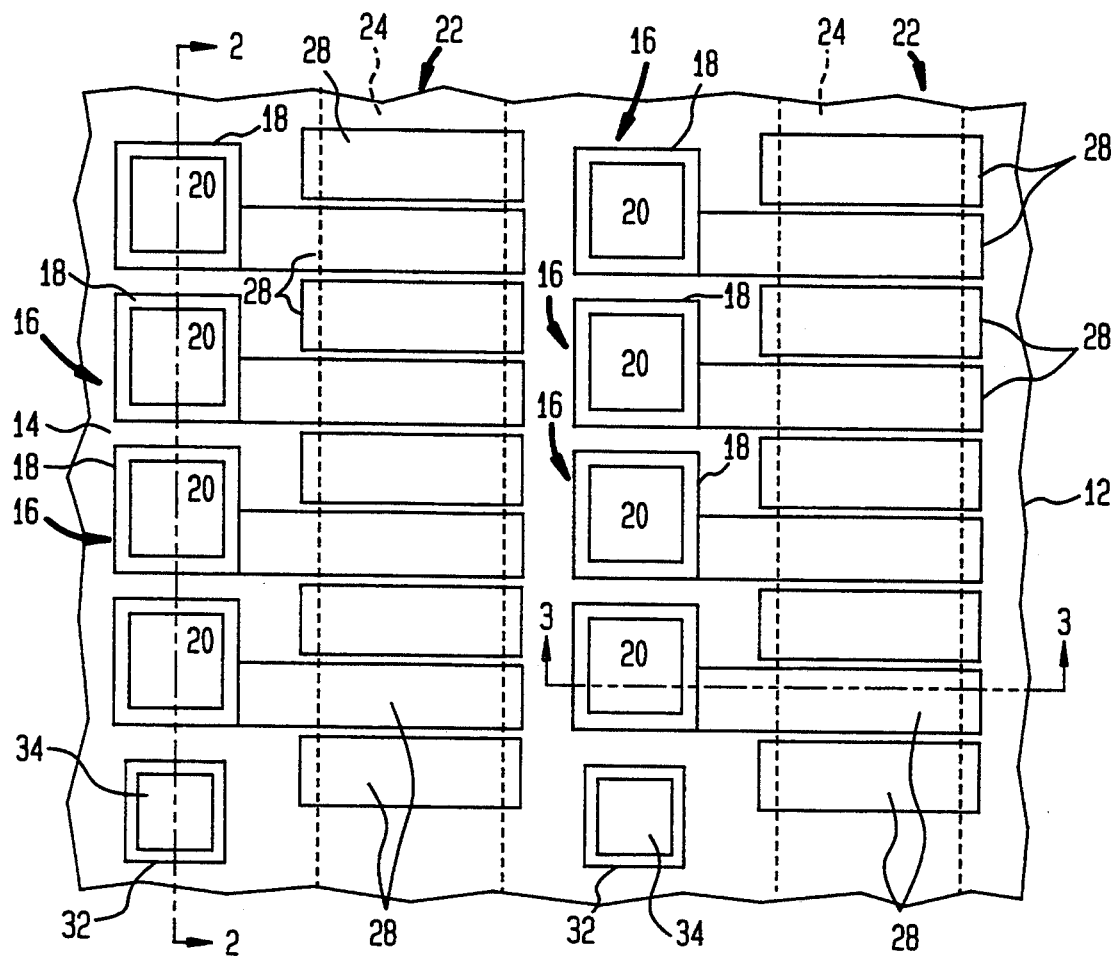
FIG. 1 is a top plan view of a portion of a CCD image sensor in accordance with the present invention.
Figure 2:
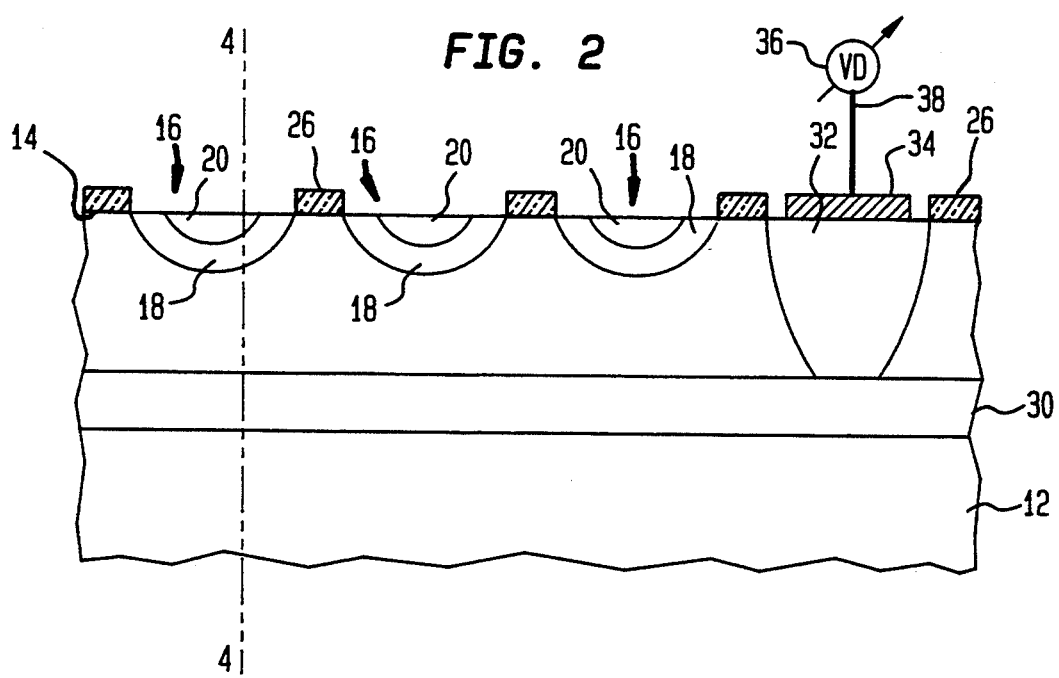
FIG. 2 is a sectional view taken along a dashed line 2—2 of FIG. 1.
Figure 3:
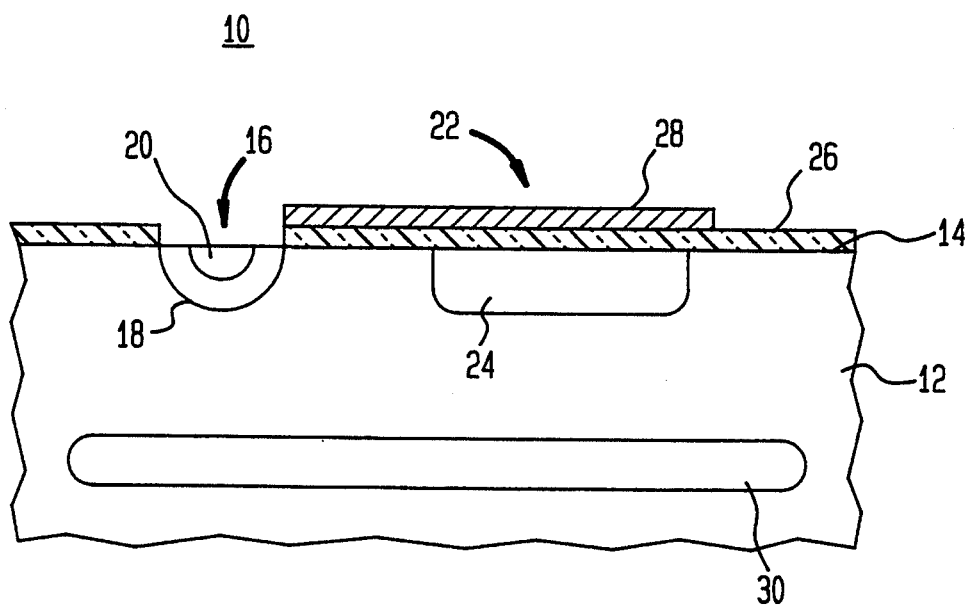
FIG. 3 is a sectional view taken along a dashed line 3—3 of FIG.

Referring now to FIGS. 1, 2 and 3, there are shown a top plan view (FIG. 1), a sectional view (FIG. 2) along a dashed line 2—2 of FIG. 1, and a sectional view (FIG. 3) along a dashed line 3—3 of FIG. 1 of a portion of a solid state image sensor 10 in accordance with the present invention. In%age sensor 10 comprises a body 12 of a semiconductor material of one conductivity type, typically single crystalline silicon of p-type conductivity, having a surface 14. In the body 12 at the surface 14 is are a plurality of photodetectors 16. The photodetectors 16 are arranged in an array of a plurality of parallel lines with the photodetectors being spaced along the lines to form the photodetectors in rows and columns. As shown, each photodetector 16 is a photodiode comprising a first region 18 of n-type conductivity in the body 12 and extending to the surface 14, and a second region 20 of p-type conductivity within the first region 18 and extending to the surface 14. However, the photodetectors 16 can be of any desired type photodetector which can convert photons to electrons and holes.

Along each of the lines of photodetectors 16 is a separate CCD shift register 22. Each CCD shift register 22 comprises a channel region 24 of n-type conductivity in the body 12 and extending to the surface 14. The channel region 24 extends parallel to but is spaced from the adjacent line of photodetectors 16. A layer 26 of an insulating material, typically silicon dioxide, is on the body surface 14 and over the channel region 24. A plurality of gate electrodes 28 of a conductive material, such as doped polycrystalline silicon, are on the insulating material layer 26 and extend across the channel region 24. For a two-phase CCD shift register 22, there are two gate electrodes 28 adjacent each of the photodetectors 16. As shown, one gate electrode 28 at each of the photodetectors 16 extends across the space between the channel region 24 and the photodetector 16 to also serve as a transfer gate for transferring charges, i.e., electrons, from the photodetector 16 to the channel region 24.

A buried region 30 of n-type conductivity is within the body 12 and spaced from the surface 14. The buried region 30 extends under all of the regions of the image sensor 10 which accumulate or transfer charge carriers. Thus, as shown in FIG. 2, the buried region 30 extends under the photodetectors 16, which photogenerate and accumulate charge carriers. Also, as shown in FIG. 3, the buried region 30 extends under the channel regions 24 of the CCD shift registers 22, which store and transfer electrons, and the portions of the gate electrodes 28 which extend between the channel regions 24 and the photodetectors 16, which transfer electrons. At least one contact region 32 extends through the body 12 from the surface 14 to the buried region 30. Each contact region 32 is of the same conductivity type as the buried region 30 but of higher conductivity, i.e., n+ type conductivity. As shown in FIG. 2, a contact electrode 34 is on each of the contact region 32. Each contact electrode 34 is of a conductive material, such as a metal. Each contact electrode 34 is connected to a power supply 36 by a wire 38 so as to permit the biasing of the buried region 30 with a voltage VD. Alternatively, the wire 38 can be coupled to a switch (not shown) which is coupled to a voltage source having a fixed output voltage VD with the switch being closed when VD is to be coupled to region 30 and being open when VD is not to be coupled to region 30. The switch could be formed in body 12 and could be a field effect or bipolar transistor having a gate (base) to which a control signal (not shown) is applied to control states thereof.

In the operation of the image sensor 10, illumination from the image being sensed enters the photodetectors 16 which photogenerate charge carriers. The charge carriers are accumulated in the photodetectors 16 until the gate electrodes 28 which extend to the photodetectors 16 are suitably biased to transfer the charge carriers to the channel regions 24. The gate electrodes 28 are then suitably biased to transfer the charge carriers along the channel regions 24 to an output circuit (not shown). If it is desired to reset the image sensor 10, a voltage VD is applied to the buried region 30 through the contact electrode 34 and contact region 32 and then into the power supply 36. A suitable bias results in any charge carriers which are in the photodetectors 16 or channel region 24 being transferred into the buried region 30. The charge carriers are then carried off through the contact region 32. When the voltage applied to the buried region is removed, the operation of the CCD image sensor 10 can then be resumed. Thus, the CCD image sensor 10 is reset and normal operation can be resumed.

In a typical illustrative embodiment of image sensor 30, body 12 and region 20 are of p-type conductivity and each have an impurity concentration in the range of $10^{12}$ to $10^{16}$ impurities/cm$^3$, region 18 is of n-type conductivity and has an impurity concentration in the range of $10^{12}$ to $10^{16}$ impurities/cm$^3$, and region 30 and contact region 32 are of n-type conductivity and each has an impurity concentration in the range of $10^{17}$ to $10^{20}$ impurities/cm$^3$. The thickness of contact region 32 can vary considerably with 4 to 10 microns being a typical range. The voltage VD is typically in a range of +5 to +15 volts depending on the thickness of contact region 32. Region 30 could also have an impurity concentration in the range of $10^{12}$ to $10^{20}$ impurities/cm$^3$.

Figure 4:
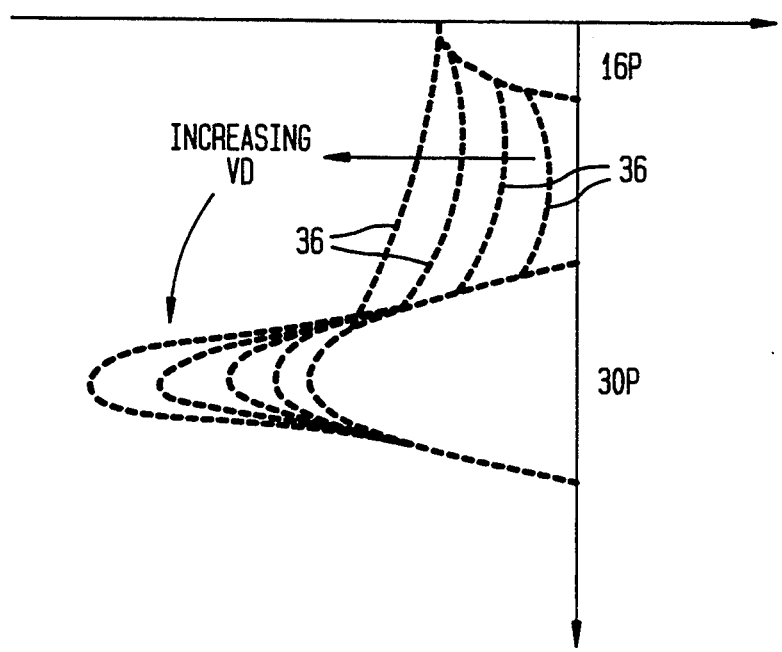
FIG. 4 is a potential diagram for a portion of the CCD image sensor taken along a dashed line 4—4 of FIG. 2.

Referring now to FIG. 4, there is shown a potential energy diagram of the image sensor 10 across the region indicated by a dashed line 4—4 in FIG. 2. In the diagram, a horizontal line with an arrow depicts the surface 14 of the body 12, and a vertical line with an arrow depicts depth into the body 12 from the surface 14. Electrostatic potential is indicated horizontally with negative electrostatic potential being to the left of the vertical line and positive electrostatic potential being to the right of the vertical line. There is shown an electrostatic potential well 16P of the photodetector 16 at the surface 14 of the body 12, and an electrostatic potential 30P of a buried region 30 is shown below the surface 14. The lines 36 between the potential well 16P and the potential well 30P indicate the potential in the body 12 between the photodetector 16 and the buried region 30 as the voltage VD is increased. As can be seen in FIG. 4, as the voltage VD applied to the buried region 30 is increased, the potential well in the body 12 between the photodetector 16 and the buried region 30 also increases. As the potential well in the body 12 between the photodetector 16 and the buried region 30 increases, electrons in the photodetector flow through the body 12 to the buried region 30. Thus, the photodetectors 16 are drained of any electrons to reset the photodetectors 16. Since the buried region 30 is also under the CCD shift registers 22, electrons stored in the channel region 24 are drained to the buried region 30 in the sa/ne manner as described above. Thus, any region of the image sensor 10 which accumulates or transfers electrons can be drained of the electrons so as to reset the image sensor 10.

To make the CCD image sensor 10, the buried region 30 is first formed in the body 12. This can be achieved by ion implanting ions of an n-type conductivity material into the body 12 to the desired depth. However, the buried region 30 is more preferably formed by using a wafer of silicon on which a layer of silicon is epitaxially deposited. Before depositing the epitaxial layer, an n-type conductivity dopant is diffused or ion implanted into the surface of the wafer in the areas where the buried region 30 is to be formed. After the epitaxial layer is deposited over the wafer and the region containing the n-type conductivity dopant, the device is heated to partially diffuse the dopant into the body and partially outdiffuse the dopant from the wafer into the epitaxial layer and thereby form the buried region 30. The buried region 30 can be formed by any other method well known in the art of making semiconductor devices. The photodetectors 16 and CCD shift registers 22 are then formed in any desired manner known in the art. During these steps, an n-type dopant is diffused or ion implanted through the body 12 to the buried region 30 to forth the contact region 32.

Thus, there is provided by the present invention a CCD image sensor 10 having a buried region 30 under the portions of the image sensor 10 which store or transfer electrons, i.e., the photodetectors 16 and the CCD shift registers 22. Application of an appropriate bias to the buried region 30 causes any electrons in these regions to be transferred to the buried region 30 where they are carried off. This permits the image sensor 10 to be reset. When the bias is removed from the buried region 30, the image sensor can be returned to normal operation. Thus, the image sensor 10 can be quickly reset and then resume normal operation.

It is to be appreciated and understood that the specific embodiments of the invention are merely illustrative of the general principles of the invention. Various modifications may be made consistent with the principles set forth. For example, as previously indicated, the photodetectors 16 may be of any type other than a photodiode, such as a photocapacitor. Still further, instead of using one of the gate electrodes 28 of the CCD shift registers 22 as a transfer gate between a photodetector and the channel region of the CCD shift register, a separate transfer gate can be used. Still further, the channel region 30 can extend under any or all of the regions of the image sensor 10 which store or transfer electrons to permit resetting of that region. Furthermore, the CCD image sensor can be of any known structure other than that described above. Still further, the contact region 32 can be formed by means other than ion-implantation or diffusion, such as being formed of a plug of conductive polycrystalline silicon.

What is claimed is:

1. An image sensor comprising:
    a body of a semiconductor material of one conductivity type having a surface;
    a plurality of photodetectors in the body at the surface and arranged in at least one line;
    a shift register in the body at the surface and extending along the line of photodetectors;
    a buried region of a conductivity type opposite that of the body within the body and spaced from the surface, the buried region extending under all of the photodetectors and the shift register; and
    a contact region extending through the body from the surface to the buried region, the contact region being of the same conductivity type as the buried region but of higher conductivity.

2. The image sensor of claim 1 further comprising a contact electrode located on a surface of the contact region and means electrically connecting the contact electrode to a source of current to permit the buried region to be selectively biased.

3. The image sensor of claim 2 in which the shift register comprises a channel region of a conductivity type opposite that of the body within the body and extending to the surface, the channel region extending along but spaced from the line of photodetectors, and a plurality of gate electrodes over and electrically insulated from the channel region with at least one of the gate electrodes being adjacent each of the photodetectors.

4. The image sensor of claim 3 further comprising means between the shift register and the photodetectors for transferring electrons from the photodetectors to the channel region of the shift register.

5. The image sensor of claim 4 in which the photodetectors are arranged in a plurality of spaced, substantially parallel lines, a plurality of shift registers corresponding to the number of lines of photodetectors, wherein a shift register extends along each of the lines of photodetectors and the buried region extends under all of the photodetectors and shift registers.

* * * * *